(12) United States Patent
Hsu et al.

(10) Patent No.: US 9,117,506 B2
(45) Date of Patent: Aug. 25, 2015

(54) TRACKING MECHANISM

(71) Applicant: TAIWAN SEMICONDUCTOR MANUFACTURING COMPANY, LTD., Hsinchu (TW)

(72) Inventors: Kuoyuan (Peter) Hsu, San Jose, CA (US); Sung-Chieh Lin, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 42 days.

(21) Appl. No.: 14/145,152

(22) Filed: Dec. 31, 2013

(65) Prior Publication Data

US 2015/0187397 A1    Jul. 2, 2015

(51) Int. Cl.
*G11C 5/14* (2006.01)
*G11C 7/14* (2006.01)
*G11C 13/00* (2006.01)
*G11C 11/16* (2006.01)

(52) U.S. Cl.
CPC ........ *G11C 7/14* (2013.01); *G11C 5/145* (2013.01); *G11C 5/147* (2013.01); *G11C 11/1673* (2013.01); *G11C 13/004* (2013.01)

(58) Field of Classification Search
CPC ............ G11C 13/004; G11C 11/1673; G11C 13/003; G11C 11/5642; G11C 27/028; G11C 5/147; G11C 5/145
USPC ........... 365/189.011, 189.15, 189.07, 189.08, 365/189.09
See application file for complete search history.

(56) References Cited

U.S. PATENT DOCUMENTS 8,693,272 B2 * 4/2014 Jung et al. .................. 365/206

* cited by examiner

*Primary Examiner* — Fernando Hidalgo
(74) *Attorney, Agent, or Firm* — Lowe Hauptman & Ham, LLP (57) ABSTRACT

In a method, a current value of a memory cell of a tracked circuit is determined. The memory cell is coupled with a data line. A tracking current value of a tracking memory cell of a tracking circuit is determined. The tracking memory cell is coupled with a tracking data line. A current value of a transistor of the tracking circuit is determined, based on a current value of a transistor of the tracked circuit, the current value of the memory cell, and the tracking current value of the tracking memory cell. A signal of the tracked circuit is generated based on a signal of the tracking circuit.

20 Claims, 7 Drawing Sheets

TRACKING MECHANISM

FIELD

The present disclosure is related to a tracking mechanism.

BACKGROUND

Read tracking refers to providing read signals for a memory cell based on corresponding tracking read signals that are designed to ensure the read signals have sufficient margins for a successful read operation under various conditions. A weakest memory cell refers to a memory cell having the worst read margin among a plurality of memory cells, such as a plurality of memory cells in a memory macro. In various approaches, a signal value of the weakest cell is estimated based on a statistical value of a corresponding signal of the plurality of memory cells, such as a $-3\sigma$, a $-4\sigma$, a $-5\sigma$ or a $-6\sigma$, etc. Tracking signals are then generated to provide signals for the weakest cell of the plurality of cells. Write tracking operates in a similar way as reading, except for write signals.

In some approaches, after signal values of the weakest cell are identified based on the corresponding statistical values, a delay circuitry built on logic devices is provided to generate signals for the memory cells based on the identified signal values of the weakest cell. Logic devices, however, do not correlate well with memory cells across different manufacturing process, voltage, and temperature (PVT) conditions or corners. As a result, additional delay margins are added for the delay circuitry to cover the worst conditions of the various PVT corners, which results in a longer operational cycle time for the memory macro. Logic circuitry for the additional delay margins also takes up additional layout space, resulting in an increased area for the chip embodying the memory macro.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A tracking circuit generates signals for a memory cell circuit, and has circuit components similar to those of the memory circuit. Compared with circuits that use logic devices for the tracking circuit, operational cycle times for memory cells of various embodiments of the present disclosure are improved.

Memory Macro

Figure 1:
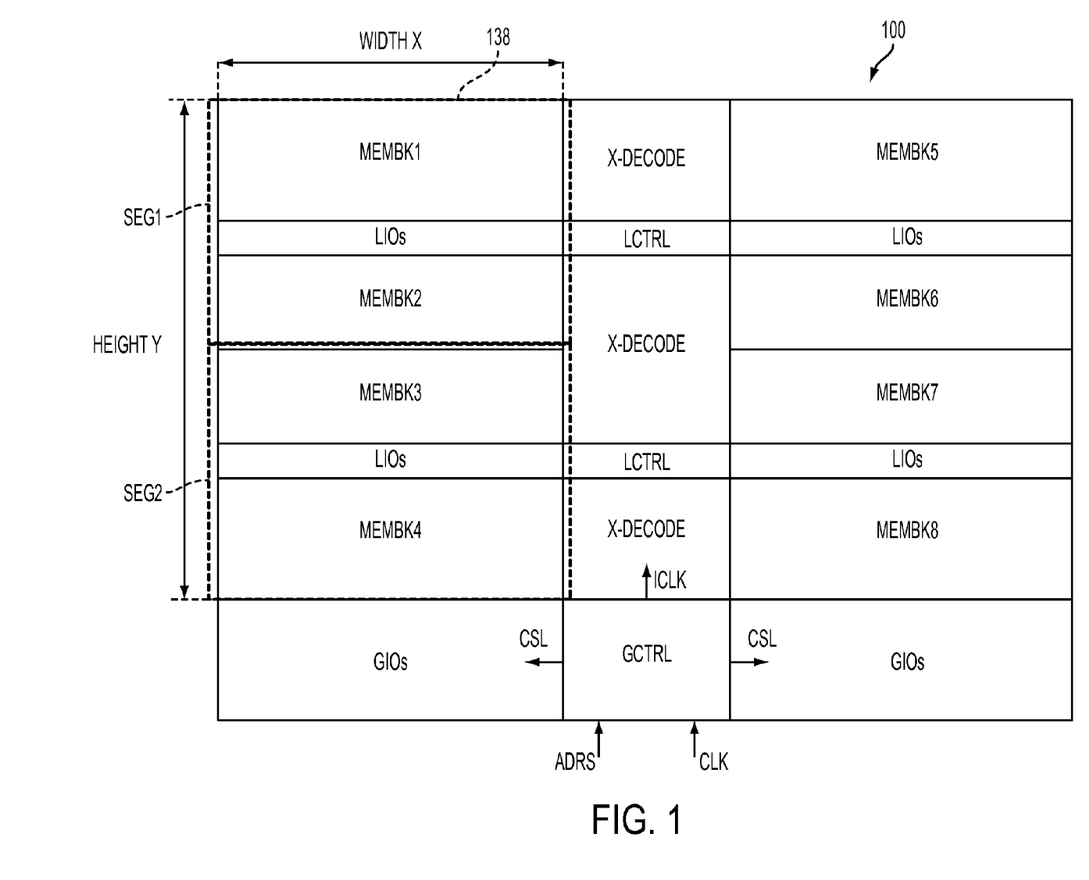
FIG. 1 is a diagram of a memory macro, in accordance with some embodiments.

FIG. 1 is a diagram of a memory macro 100, in accordance with some embodiments. Memory macro 100 is a static random access memory (SRAM) macro, and is used for illustration. Other types of memories are within the scope of various embodiments.

Memory macro 100 is symmetrical. For example, with reference to decoders X-Decode, local control circuits (LCTRLs), or a global control circuit (GCTRL), circuit elements on the left side of memory macro 100 are similar to circuit elements on the right side of memory macro 100. For another example, memory macro 100 includes two memory arrays. One memory array is on the left side of memory macro 100 and one memory array is on the right side of memory macro 100. For illustration, one memory array on the left side of memory macro 100 is labeled memory array 138 that has a width X and a height Y.

Memory array 138 includes a plurality of memory segments. For illustration, two memory segments SEG1 and SEG2 of memory array 138 shown. A different number of memory segments is within the scope of various embodiments.

Each memory segment includes two memory banks. For example, memory segment SEG1 includes two memory banks MEMBK1 and MEMBK2, and memory segment SEG2 includes two memory banks MEMBK3 and MEMBK4. For illustration, only memory segments SEG1 and SEG2 are labeled. Details of memory segments other than memory segments SEG1 and SEG2 are not labeled. For example, details of memory banks MEMBK5, MEMBK6, MEMBK7, and MEMBK8 are not labeled.

In a memory segment, two memory banks share a row of a local input-output circuit LIO. For example, memory bank MEMBK1 and memory bank MEMBK2 share one row of LIOs, memory bank MEMBK3 and memory bank MEMBK4 share one row of LIOs, memory bank MEMBK5 and memory bank MEMBK6 share one row of LIOs, and memory bank MEMBK7 and memory bank MEMBK8 share one row of LIOs.

Memory cells in a memory bank are arranged in rows and columns. As a result, memory cells in a memory segment and in a memory array are also arranged in rows and columns. A memory cell is described with reference to FIG. 2 below, and is labeled MEMCELL. Different configurations of a memory segment are within the scope of various embodiments.

Based on an address ADDRS of a memory cell to be accessed for a read or a write operation, an address decoder X-Decode provides the row-address of the corresponding memory cell to be accessed.

A local control LCTRL controls a corresponding local LIO.

A global input-output circuit GIO serves to transfer data between memory cells in a corresponding memory array and other circuits outside of memory macro 100.

Global control GCTRL provides the row address, the column address, pre-decode, clock, and other signals for memory macro 100. Global control GCTRL also controls data transfer between memory cells in the memory array and circuits outside of memory macro 100. For example, global control GCTRL, based on a clock signal CLK and address ADDRS of a memory cell to be read, generates a column select signal CSL to select a column to be pre-charged, to be read, etc. GCTRL also generates a clock signal RGCLK (not labeled) based on clock signal CLK. Other clock signals in memory macro are generated based on clock signal RGCLK.

Memory Cell

Figure 2:
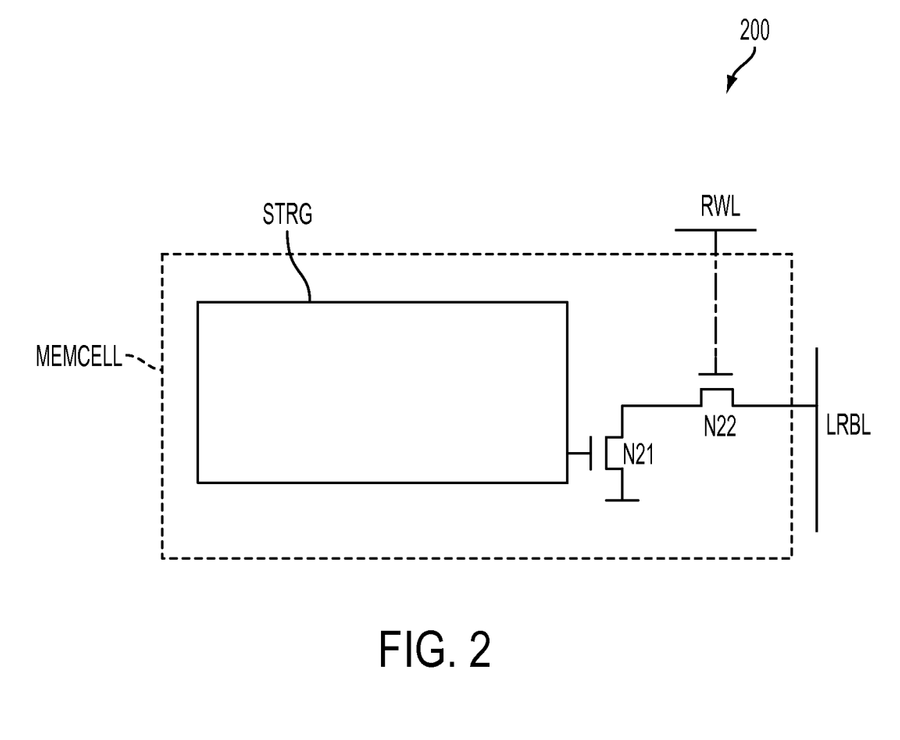
FIG. 2 is a diagram of a memory cell of the memory macro in FIG. 1, in accordance with some embodiments.

FIG. 2 is a diagram of a circuit 200, in accordance with some embodiments. Circuit 200 includes a memory cell MEMCELL coupled with a read word line RWL and a read bit line LRBL. Read bit line LRBL is also call a local read bit line, which is distinguished from a global read bit line, such as a global read bit line GRBL1 to GRBLM in FIG. 3.

Memory cell MEMCELL includes a storage unit STRG and a read port that includes two N-type metal oxide semiconductor (NMOS) transistors N21 and N22.

A gate of transistor N21 receives data from storage unit STRG. A source of transistor N21 receives a supply reference voltage VSS (not labeled), which, in some embodiments, is ground. A drain of transistor N21 is coupled with a source of transistor N22. A gate of transistor N22 is coupled with read word line RWL. A drain of transistor N22 is coupled with read bit line LRBL. In some embodiments, read word line RWL is coupled with each gate of each transistor N22 in a row of memory cells MEMCELL in a memory bank. Further, local read bit line LRBL is coupled with each drain of each transistor N22 in a column of memory cells MEMCELL in a memory bank.

When memory cell MEMCELL is accessed for a read operation, detecting a logical value on read bit line LRBL reveals the logical data stored in memory MEMCELL. For example, in some embodiments, in a read operation, read bit line LRBL is pre-charged with a high logical value. Pre-charge refers to charging before a read or a write operation. Further, read word line RWL is activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line LRBL therefore remains at the pre-charged high logical value. In other words, the high logical value on read bit line LRBL corresponds to the high logical data stored in storage unit STRG.

In contrast, when storage unit STRG stores a low logical value, storage unit STRG provides a high logical value to the gate of transistor N21. As a result, transistor N21 is turned on. Because transistors N21 and N22 are turned on, read bit line LRBL is pulled to a low logical value at the source transistor N21. Effectively, the low logical value on read bit line LRBL corresponds to the low logical value of the data stored in storage unit STRG.

In some embodiments, a logical value of a global read bit line GRBL is set according to the logical value of a corresponding local read bit line LRBL. Therefore, in some embodiments, reading data on a local read bit line LRBL is by reading data on the corresponding global read bit line GRBL, and is explained below.

Memory Array

Figure 3:
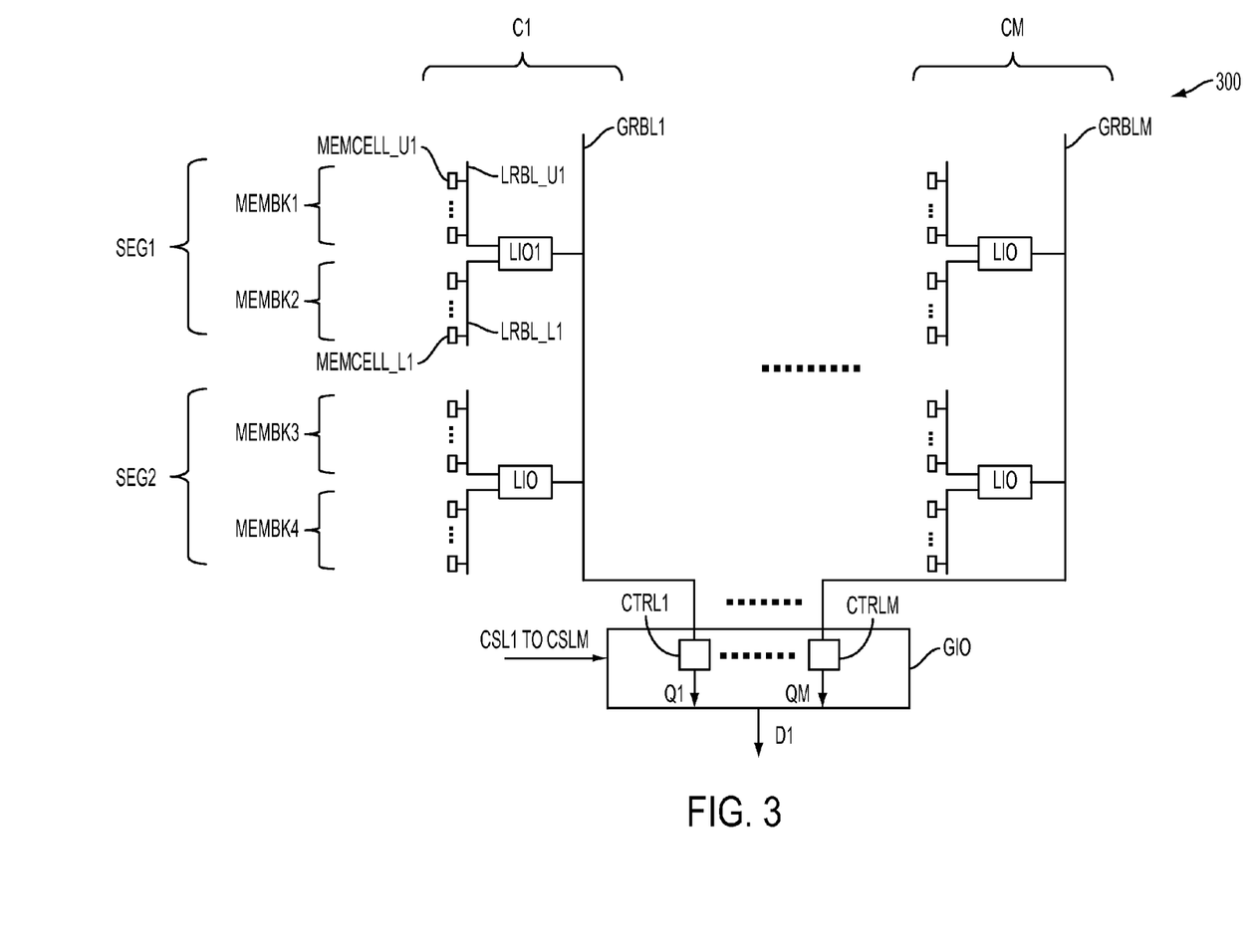
FIG. 3 is a diagram of a portion of a memory array of the memory macro in FIG. 1, in accordance with some embodiments.

FIG. 3 is a diagram of a portion 300 of memory array 138 in FIG. 1, in accordance with some embodiments. In some embodiments, memory array 138 includes a plurality of memory array portions 300.

Memory array portion 300 includes M columns labeled columns C1 to CM, wherein M is an integer number. For illustration, a column C1 to CM is called a column C. Each column C includes a plurality of local input-output LIOs corresponding to a plurality of segments. In the illustration of FIG. 3, memory array portion 300 includes two segments SEG1 and SEG2. Each of segments SEG1 and SEG2 in turn includes a local input-output LIO in a column C.

A local input-output (LIO) is coupled with two local read bit lines LRBL and a global read bit line GRBL. An LIO is also called a data circuit. For example, in FIG. 3, LIO1 of column C1 is coupled with two local read bit lines LRBL_U1 and LRBL_L1 and a global read bit line GRBL1. Each local read bit line LRBL, such as a local read bit line LRBL_U1 or LRBL_L1, is coupled with a plurality of memory cells MEMCELL and a local pre-charge circuit. For illustration, one memory cell MEMCELL_U1 coupled to read bit line LRBL_U1 and one memory cell MEMCELL_L1 coupled to read bit line LRBL_L1 are labeled. The local pre-charge circuits are not shown in FIG. 3, but are shown and explained with reference to FIG. 4. Details of circuit connections between memory cell MEMCELL with local read bit line LRBL are described above with reference to FIG. 2. Memory cells MEMCELL coupled with the corresponding read bit line LRBL belong to a corresponding memory bank. For example, with reference to a column C, memory cells coupled with read bit line LRBL_U1 of segment SEG1 belong to memory bank MEMBK1. Memory cells coupled with read bit line LRBL_L1 of segment SEG1 belong to memory bank MEMBK2 of segment SGE1. Memory cells coupled with two read bit lines of segment SEG2 belong to memory banks MEMBK3 and MEMBK4, respectively, etc.

A plurality of global read bit lines, labeled GRBL1 to GRBLM, is coupled with a global input-output (GIO) circuit in FIG. 1. When the data stored in a memory cell is read, the data is reflected on a corresponding local read bit line, local input-output LIO, and a global read bit line. The data is then controlled by a corresponding control circuit CTRL1 to CTRLM to a corresponding output Q1 to QM, and is provided to circuits outside of memory macro 100 as a data line D1. In such a condition, when memory array 138 includes N memory portions 300, memory array 130 also includes N data lines from data line D1 to data line DN (not shown), wherein N is integer number. For example, as shown in FIG. 3, when the data stored in memory MEMCELL_U1 is read, the data is reflected on local read bit line LRBL_U1, local input-output LIO1, global read bit line GRBL1, and is transferred by control circuit CTRL1 to output Q1 and data line D1.

Global input-output (GIO) circuit receives global read bit lines GRBL1 to GRBLM corresponding to columns C1 to CM. GIO circuit is also called a data circuit. GIO circuit, based on a column select signal CSL1 to CSLM, selects one global read bit line out of the plurality of global read bit lines GRBL1 to GRBLM to transfer data on the selected global read bit line as data on a corresponding output Q1 to QM to be read. In some embodiments, data on multiples global read bit lines each from a circuit GIO is read at the same time. For example, each circuit GIO of the plurality of circuits GIO (not shown) selects data on global read bit line GRBL1 of column C1 for reading. For another example, each circuit GIO of the plurality of circuits GIO selects data on global read bit line GRBL2 of column C2 for reading, and each circuit GIO of the plurality of circuits GIO selects data on global read bit line GRBL3 of column C3 for reading, etc.

A control circuit CTRL1 to CTRLM is used to control the data on a corresponding global read bit line GRBL1 to GRBLM to an output Q1 to QM, respectively. For illustration, a control circuit CTRL1 to CTRLM is called a control circuit CTRL. Each of the data on output Q1 to QM is then selected as data on data line D1.

Memory array portion 300 having two segments SEG1 and SEG2 is for illustration. A different number of segments in a memory array portion 300 is within the scope of various embodiments.

Circuit with Tracking Mechanisms

Figure 4:
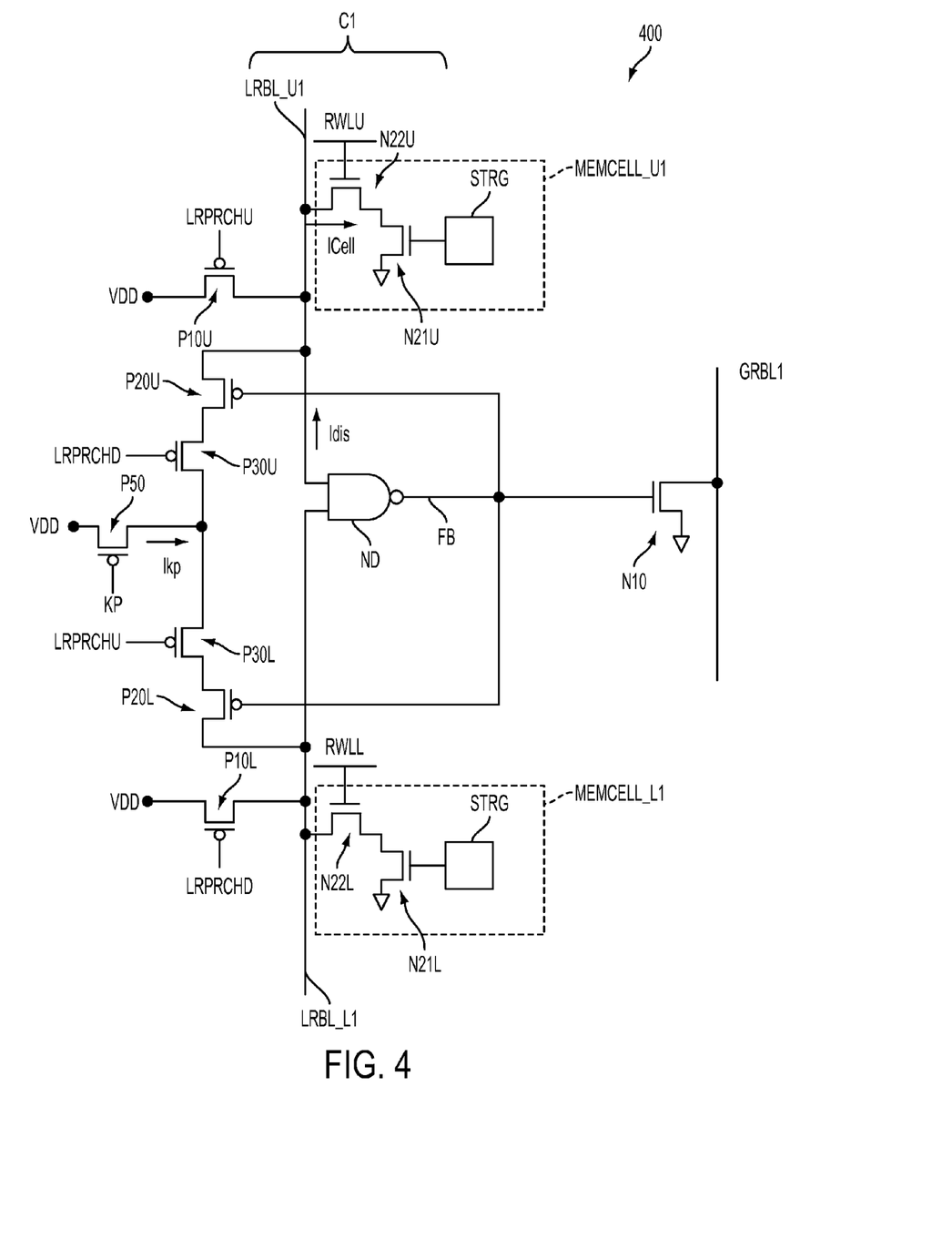
FIG. 4 is a diagram of a circuit having a memory cell in FIG. 2, in accordance with some embodiments.

FIG. 4 is a diagram of a circuit 400, in accordance with some embodiments. Circuit 400 includes a column C1 in FIG. 3 and is used with tracking circuit 500 in FIG. 5. For simplicity, various circuit components of column C1 in FIG. 3 are not shown. In some embodiments, all circuit elements in FIG. 4 excluding memory cells MEMCELL_U1 and MEMCELL_L1 are part of an LIO, such as LIO1 in FIG. 3. Embodiments of the present disclosure are not limited to locations of circuit components of an LIO. As illustratively shown in FIG. 4, circuit 400 is symmetrical with reference to transistor P50, NAND gate ND, or a gate of transistor N10.

Local read bit line LRBL_U1 is coupled with a plurality of memory cells. For simplicity, only memory cell MEMCELL_U1 in FIG. 3 is shown. A drain of transistor N22U of MEMCELL_U1 is coupled with read bit line LRBL_U1.

A PMOS transistor P10U serves to pre-charge read bit line LRBL_U1. Pre-charge refers to charging before a read or a write operation. For example, during a pre-charge mode, signal LRPRCHU at a gate of transistor P10U is applied with a low logical value to turn on transistor P10U. As a result, read bit line LRBL_U1 at a drain of transistor PU10 is pulled to voltage VDD at a source of transistor P10U. Transistor P10U is turned on or off by signal LRPRCHU at the gate of transistor P10U, which is the same signal applied to a gate of transistor P30L. Effectively, transistor P10U and transistor P30L are turned on or turned off at the same time.

A PMOS transistor P20U is used to electrically disconnect transistor P50 from read bit line LRBL_U1 to prevent leakage current after NAND gate ND has processed the read data carried by read bit line LRBL_U1. For illustration, read bit line LRBL_U1 carries a low logical value for reading. As soon as NAND gate ND recognizes the low logical value, NAND gate ND provides a high logical value to signal FB. As a result, transistor P20U is turned off, and no current flows from read bit line LRBL_U1 to other circuits through transistor P20U. Effectively, because NAND gate ND has recognized the read data on read bit line LRBL_U1, transistor P50 is electrically disconnected from read bit line LRBL_U1 to prevent any leakage current therefrom.

A PMOS transistor P30U is used to select a memory cell coupled with read bit line LRBL_U1 for reading. As illustratively shown in FIG. 4, transistor P30U is controlled by signal LRPRCHD, which is the same signal applied to a gate of transistor P10L. Effectively, transistor P30U and transistor P10L are turned on or turned off at the same time.

PMOS transistor P50 serves as a voltage keeper for read bit line LRBL_U1 and read bit line LRBL_L1. In some embodiments, when transistor P50 is electrically coupled to read bit line LRBL_U1, transistor P50 is electrically disconnected from read bit line LRBL_L1, and vice versa. For example, when both transistor P20U and transistor P30U are turned on and electrically couple transistor P50 to read bit line LRBL_U1, at least one of transistor P30L or transistor P20L is turned off, acts as an open circuit, and electrically disconnects transistor P50 from read bit line LRBL_L1. In such a condition, read bit line LRBL_U1 is pulled to voltage VDD at the source of transistor P50. In other words, transistor P50 keeps read bit line LRBL_U1 at a specified voltage VDD at the source of transistor P50, and is called a voltage keeper. In some embodiments, signal KP at the gate of transistor P50 is applied with a low logical value so that, in operation, PMOS transistor P50 is always turned on.

NAND gate ND receives read bit lines LRBL_U1 and LRBL_L1 as inputs, and provides signal FB as an output. Signal FB is provided to gates of transistor P20U, P20L, and N10. By operation of NAND gate ND, when at least one of read bit line LRBL_U1 or read bit line LRBL_L1 is logically low, signal FB is logically high. As a result, both transistors P20U and P20L are turned off, and transistors P20U, P30U, P50, P30L, and P20L are electrically disconnected from read bit line LRBL_U1 and read bit line LRBL_L1. Further, when signal FB is logically high, transistor N10 is turned on, which pulls global read bit line GRBL1 to a low logical value at a source of transistor N10.

Read bit line LRBL_L1 and associated circuit elements coupled with read bit line LRBL_L1 function in a similar manner as read bit line LRBL_U1 and associated circuit elements coupled with read bit line LRBL_U1. For example, read bit line LRBL_L1 is coupled with memory cell MEMCELL_L1, transistor P10L, transistor P20L, and transistor P30L, which correspond to memory cell MEMCELL_U1, transistor P10U, transistor P20U, and transistor P30U, respectively. Read bit line LRBL_L1 with memory cell MEMCELL_L1, transistor P10L, transistor P20L, and transistor P30L, functions in a manner similar to read bit line LRBL_U1 with memory cell MEMCELL_U1, transistor P10U, transistor P20U, and transistor P30U.

For illustration, a low logical value stored in MEMCELL_U1 is sensed or read, which includes a pre-charge mode and a sensing mode. During the pre-charge mode, local read bit line LRBL_U1 is electrically disconnected from transistors P20U, P30U, and P50. Transistor P10U is turned on, however, to pull read bit line LRBL_U1 to voltage VDD at the source of transistor P10U. In other words, read bit line LRBL_U1 is pre-charged to voltage VDD. In some embodiments, in the pre-charge mode, transistor P10L is also turned on to pre-charge read bit line LRBL_L1.

After the pre-charge mode, the sensing mode starts. In some embodiments, one memory cell coupled to either read bit line LRBL_U1 or read bit line LRBL_L1 is sensed. For illustration, memory cell MEMCELL_U1 coupled with read bit line LRBL_U1 is sensed. As a result, transistors P20U and P30U are turned on to electrically connect read bit line LRBL_U1 to transistor P50. Further, at least one of transistors P30L and P20L is turned off to electrically disconnect read bit line LRBL_L1 from transistor P50. Additionally, signal RWLU at a gate of transistor N22U of memory cell MEMCELL_U1 is logically high to turn on transistor N22U. Because a low logical value is read, in some embodiments, MEMCELL_U1 provides a high logical value to the gate of transistor N21U. As a result, transistor N21U is turned on, and read bit line LRBL_U1 is pulled to ground or a low logical value at the source of transistor N21U. Because read bit line LRBL_U1 is logically low, signal FB is logically high, which turns on transistor N10. Consequently, global read bit line GRBL1 is pulled to a low logical value at the source of transistor N10. Effectively, global read bit line GRBL1 carries a low logical value that reflects the low logical value stored in memory cell MEMCELL_U1.

In brief, during the sensing mode, transistor P10U is turned off, transistors P20U, P30U, and P50 are turned on, and transistor P30L is turned off. Further, transistor N22U and transistor N21U are turned on. As a result, local read bit line LRBL_U1 is logically low, signal FB is logically high, transistor N10 is turned on, and global read bit line GRBL1 is logically low to reflect the low logical data stored in MEMCELL_U1.

For illustration, a current Ikp flows through transistor P50. A current Icell flows between read bit line LRBL_U1 and memory cell MEMCELL_U1. A current Idis is a current used to pull read bit line LRBL_U1 from a high logical value, such as from a pre-charged voltage VDD, to a low logical value, such as ground, at the source of transistor N21U. Tdis is a time for read bit line LRBL_U1 to transition from a high to a low logical value or to discharge read bit line LRBL_U1, Crbl is a capacitive load on read bit line LRBL_U1. Mathematically, $$Idis = Icell - Ikp$$

and $$Tdis = Idis/Crbl$$

Figure 5:
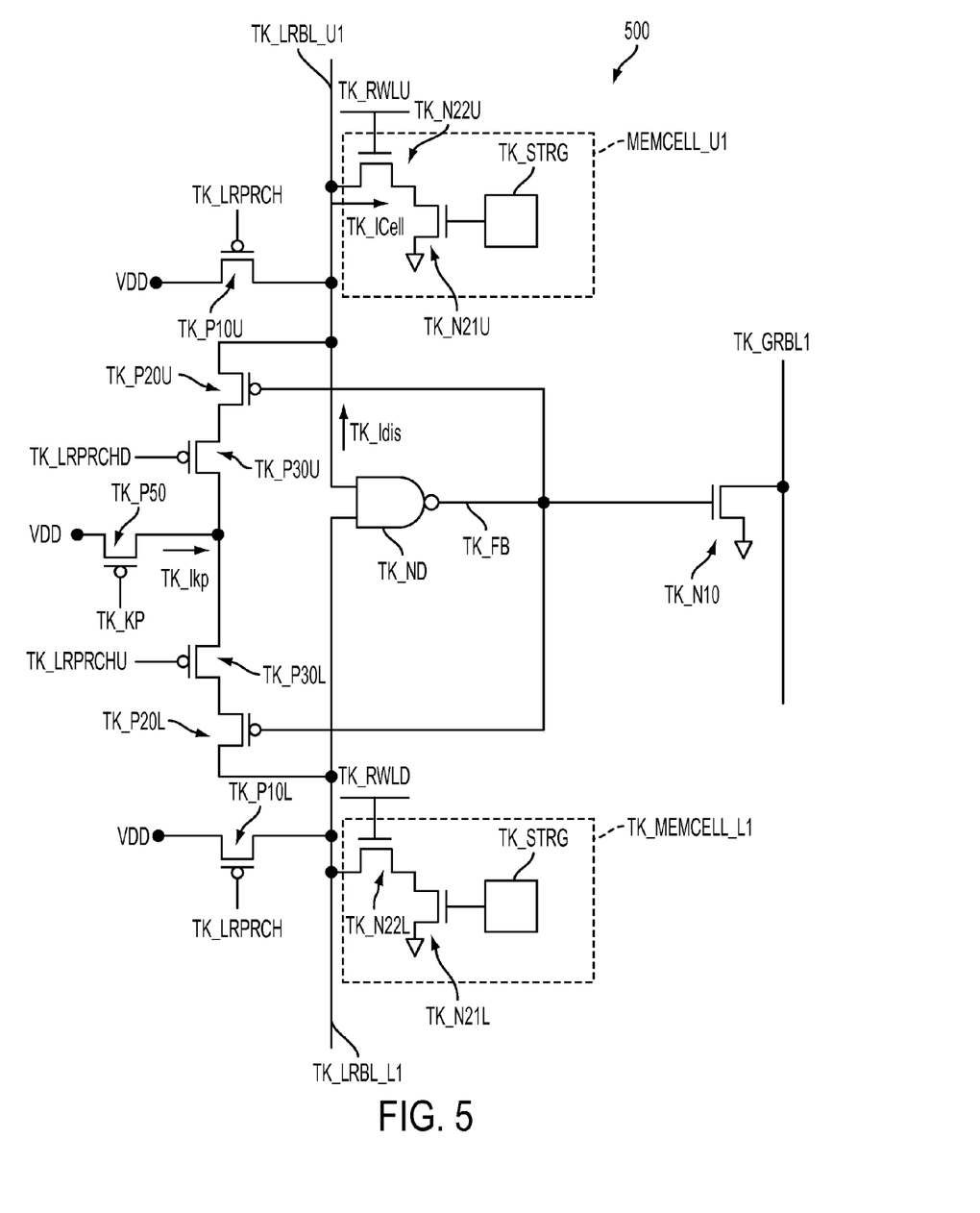
FIG. 5 is a diagram of a tracking circuit used to track the circuit in FIG. 4, in accordance with some embodiments.

FIG. 5 is a diagram of a tracking circuit 500, in accordance with some embodiments. Circuit 500 is used to track circuit 400 in FIG. 4. Stated differently, circuit 400 is tracked by tracking circuit 500. A relationship between various signals in circuits 400 and 500 is explained with reference to FIG. 7.

Circuit 500 includes circuit elements and signals similar to those of circuit 400. For example, read bit line TK_LRBL_U1, read word line TK_RWLU, memory cell TK_MEMCELL_U1, transistors TK_P10U, TK_P20U, TK_P30U, TK_P50, read bit line TK_LRBL_L1, read word line TK_RWLD, memory cell TK_MEMCELL_L1, transistors TK_P10L, TK_P20L, TK_P30L, NAND gate TK_ND, transistor TK_N10, and global read bit line TK_GRBL1 correspond to read bit line LRBL_U1, read word line RWLU, memory cell MEMCELL_U1, transistors P10U, P20U, P30U, P50, read bit line LRBL_L1, read word line RWLL, memory cell MEMCELL_L1, transistors P10L, P20L, P30L, NAND gate ND, transistor N10, and global read bit line GRBL1, respectively. In some embodiments, read word lines TK_RWLU and TK_RWLD are coupled together and receive a same signal.

Unless otherwise specified, in some embodiments, circuit elements in circuit 500 are configured in a manner similar to corresponding circuit elements in circuit 400.

Signals TK_LRPRCHD and TK_LRPRCHU at gates of transistors TK_P30U and TK_P30L are applied with a low logical value. As a result, in operation, transistor TK_P30U and transistor TK_P30L are always turned on.

Transistor TK_P10U and transistor TK_P10L are controlled by a same signal TK_LRPRCH. As a result, in a pre-charge mode, signal TK_LRPRCH is logically low, both transistors TK_P10U and TK_P10L are both turned on to pre-charge read bit lines TK_LRBL_U1 and TK_LRBL_L1 that are connected together.

In some embodiments, circuit 500 is designed to imitate circuit 400. Further, to generate a current seen by transistor TK_P50 from two memory cells instead of by a current from one memory cell like circuit 400 when one memory cell MEMCELL_U1 or memory cell MEMCELL1D is accessed, tracking read bit lines TK_LRBL_U1 and TK_LRBL_L1 are coupled together and to NAND gate TK_ND. Further, memory cells TK_MEMCELL_U1 and memory cell TK_MEMCELL_L1 are activated at the same time. Various embodiments of the present disclosure, however, are not so limited. For example, NAND gate TK_ND is coupled with either tracking read bit line TK_LRBL_U1 having memory cell TK_MEMCELL_U1 or with tracking read bit line TK_LRBL_L1 having memory cell TK_MEMCELL_L1. For another example, NAND gate TK_ND is coupled with a plurality tracking read bit lines each of which is coupled with a memory cell and is similar to tracking read bit line TK_LRBL_U1, for example.

Because read bit line TK_LRBL_U1 and read bit line TK_LRBL_L1 are coupled together, NAND gate TK_ND is affected by the load on both read bit line TK_LRBL_U1 and read bit line TK_LRBL_L1. In contrast, in circuit 400 of FIG. 1, during the sensing mode, NAND gate ND is electrically coupled to either read bit line LRBL_U1 or read bit line LRBL_L1, and is affected by either the load of read bit line LRBL_U1 or the load of read bit line LRBL_L1. For illustration, NAND gate ND is electrically coupled with read bit line LRBL_U1 and is affected by the load of read bit line LRBL_U1. Effectively, the load seen by input terminals of NAND gate TK_ND is twice the load seen by NAND gate ND in FIG. 4 during sensing. Tracking memory cells TK_MEMCELL_U1 and TK_MEMCELL_L1 are activated at the same time during operation of circuit 500 to provide twice the current provided by memory cell MEMCELL_U1. Effectively, the current provided to pull the load seen by input terminals of NAND gate TK_ND by memory cell TK_MEMCELL_U1 and memory cell TK_MEMCELL_L1 is twice the current provided by memory cell MEMCELL_U1 to NAND gate ND. As a result, the current through transistor TK_P50 is a summation of the current from two memory cells TK_MEMCELL_U1 and TK_MEMCELL_L1, and the current mismatch therebetween is thus averaged out.

In some embodiments, current TK_Ikp, current TK_Icell, current TK_Idis, time TK_Tdis, capacitive load TK_Crbl correspond to current Ikp, current Icell, current Idis, time Tdis, and capacitive load Crbl, respectively. Further, tracking circuit 500 is designed such that $$TK\_Tdis = Tdis$$

or $$TK\_Idis/TK\_Crbl = (TK\_Icell - TK\_Ikp)/TK\_Crbl = Idis/Crbl = (Icell - Ikp)/Crbl \quad (10)$$

For illustration, a relationship between current TK_Icell and current Icell is called ratio N where TK_Icell/Icell=N. For further illustration, N=2.

Based on equation (10), TK_Ikp is designed to be twice Ikp, and load TK_Crbl is also twice load Crbl. As a result, equation (10) holds true for different values of current Icell, current Ikp, and load Crbl. In some embodiments, so that TK_Ikp=2*Ikp, a size of transistor TK_P50 is designed to be about twice a size of transistor P50.

In some embodiments, a value of ratio N is determined based on simulation with reference to a statistical model of a plurality of memory cells. For illustration, a plurality of memory cells, such as the number of memory cells in memory macro 100 in FIG. 1, is used in the statistical calculation. A $-6\sigma$ value of the plurality of currents of the plurality of memory cells is used as a value for Icell. In some embodiments, the $-6\sigma$ value of the plurality of currents of corresponding plurality of memory cells is used for Icell because such a value is determined to be a current value of the weakest cell of the plurality of cells. In some embodiments, a $+1\sigma$ value of the plurality of currents of the plurality memory cell is used as a value for TK_Icell, because such a value is determined to be a value of the fastest cell of the plurality of cells. In other words, tracking signals of the fastest cell is selected to generate signals for the weakest memory cell.

The −6σ value for Icell and +1σ value for TK_Icell are used for illustration. Other values are within the contemplated scope of the disclosure. In some embodiments, a larger a −σ value is selected to represent the worst cell value, when the number memory cells of the plurality of memory cells increases. A smaller a −σ value is selected when the number of memory cells of the plurality of memory cells decreases. For example, a −3σ, −4σ, −5σ, −6σ value is used for 64, 256, 512, and 1K of memory cells, respectively.

In some embodiments, based on the −6σ for Icell and +1σ value for TK_Icell, and the statistical model of the plurality of memory cell in memory macro 100, ratio N is 1.9. For example, N=TK_Icell/Icell=1.9. The −6σ value for Icell, +1σ value for TK_Icell, and thus the value of N varies depending on different manufacturing process, operational voltage, and temperature (PVT corners), different statistical models for the plurality of cells, the statistical value σ (e.g., −6σ for Icell and +1σ value for TK_Icell), etc.

Method

Figure 6:
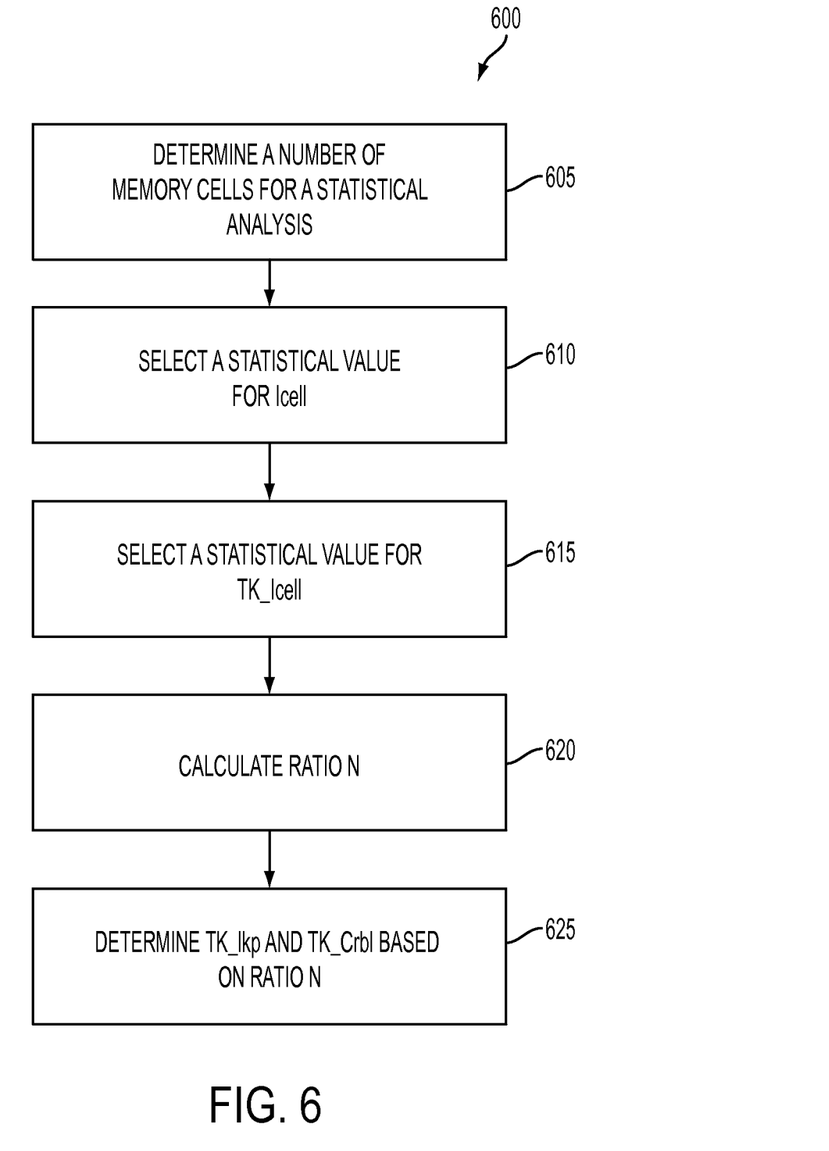
FIG. 6 is a flowchart illustrating how elements of the circuit in FIG. 5 are generated.

FIG. 6 is a flowchart of illustration how circuit 500 in FIG. 5 is designed, in accordance with some embodiments.

In operation 605, a number of a plurality of memory cells is selected to be used in a statistical model, such as a statistical model for the memory cells in memory macro 100 in FIG. 1. For illustration, the number of the plurality of memory cells is the number of memory cells in memory macro 100.

In operation 610, a statistical value is selected for current Icell that represents the worst case value of Icell of the selected plurality of memory cells. For illustration, the statistical value is −6σ, and a current value of Icell is obtained based on the statistical model In operation 615, a statistical value is selected for current TK_Icell that represents the value for a fastest memory cell of the selected plurality of memory cells. For illustration, the statistical value is +1σ, and a current value of TK_Icell is obtained based on the statistical model.

In operation 620, ratio N is calculated wherein N=TK_Icell/I_cell. For illustration ration N is 2.

In operation 625, based on equation (10)

$$TK\_Idis/TK\_Crbl=(TK\_Icell-TK\_Ikp)/$$
$$TK\_Crbl=Idis/Crbl=(Icell-Ikp)/Crbl$$

In some embodiments, TK_Ikp and TK_Crbl are selected such that equation (10) holds true. Based on the example that N=TK_Icell/I_cell=2, TK_Icell and TK_Crbl are selected such that $$TK\_Ikp=N*Ikp=2*Ikp$$

and $$TK\_Crbl=N*Crbl=2*Crbl$$

In some embodiments, transistor TK_P50 is designed to provide TK_Ikp such that TK_Ikp=N*Ikp. In some embodiments, when TK_Ikp=N*Ikp, a size of transistor TK_P50 is selected to be about N times a size of transistor P50.

For illustration, a capacitive load of each of a local read bit line is the same, and is called Crbl. To have TK_Crbl=N*Crbl, N read bit lines LRBL are coupled with NAND gate TK_ND. Additional read bit lines LRBL are coupled to NAND gate TK_ND to cause the average effect. For example, M*N read bit lines RBL are used, where M is an integer number. As a result, TK_Crbl=M*N*Crbl. In some embodiments, M is a multiplication of 2. For example, M is equal to 2, 4, 8, 16, etc. With the example of N=2, TK_Crbl=4, or 8, or 16 Crbl.

Figure 7:
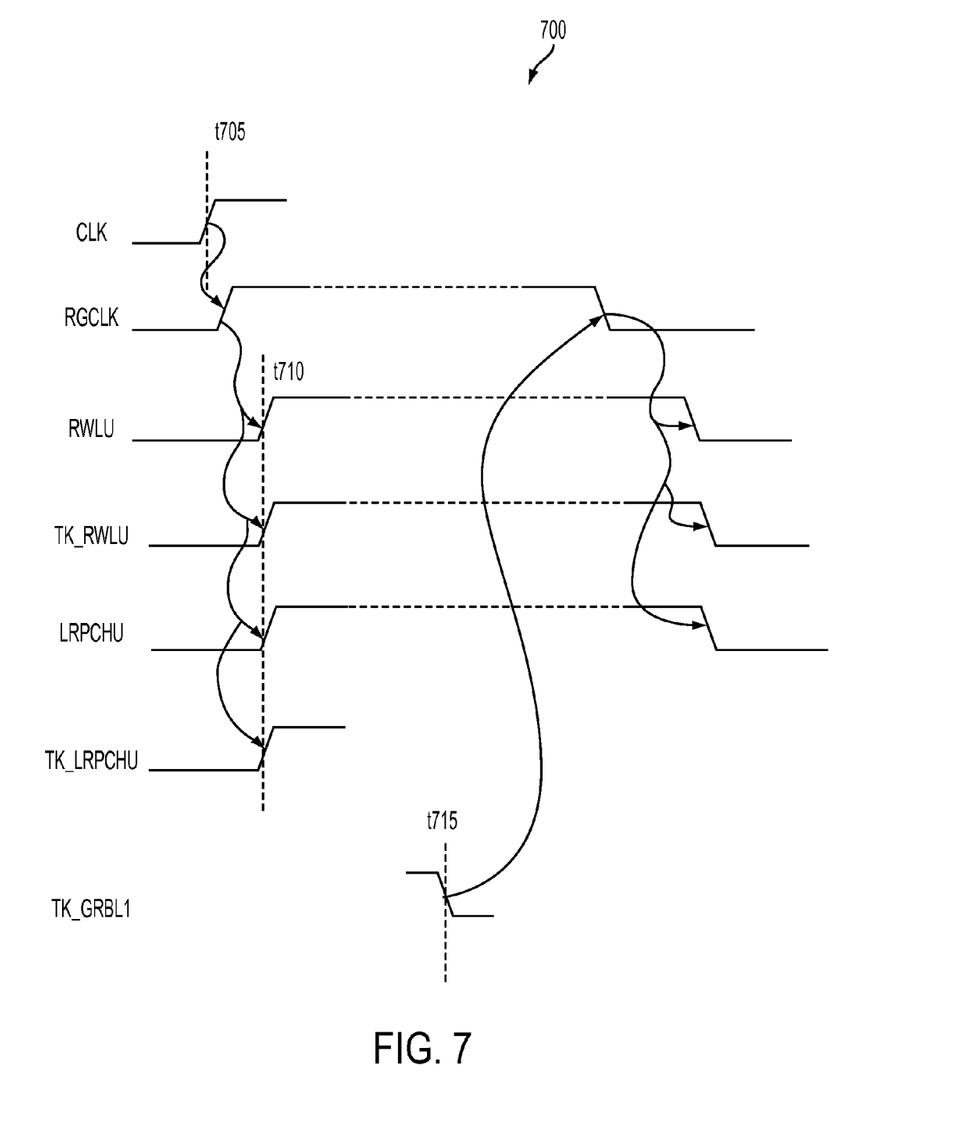
FIG. 7 is a graph of waveforms illustrating relationships of various signals in the circuits of FIG. 4 and FIG. 5.

FIG. 7 is a diagram of a circuit 700, illustrating a relationship between various signals in circuit 400 and signals in circuit 500.

At a time t705, clock signal CLK transitions from a low to a high logical value, which causes signal RGCLK to transition from a low logical value to a high logical value.

The rising edge of clock signal RGCLK activates read word line RWLU tracking read word line TR_RWLU, signal LRPCHU, and signal TK_LRPRCH, at time t710.

At time 715, tracking circuit 500 causes tracking global read bit line TK_GRBL1 to transition from a high to a low logical value. For example, tracking memory cells MEMCELL_U1 and MEMCELL_L1 are configured to cause tracking read bit lines TK_LRBL_U1 and TK_LRBL_L1 to transition to a low logical value, which causes signal TK_FB to be logically high, transistor TK_N10 to turn on, and tracking global read bit line TK_GRBL1 to be logically low.

The high to low transition of tracking global read bit line TK_GRBL1 causes signal RGCLK to transition from a high to a low logical value, which causes word line RWLU, tracking word line TK_RWLU and signal LRPRCHU to transition from a high to a low logical value.

Some embodiments regard a method. In the method, a current value of a memory cell of a tracked circuit is determined. The memory cell is coupled with a data line. A tracking current value of a tracking memory cell of a tracking circuit is determined. The tracking memory cell is coupled with a tracking data line. A current value of a transistor of the tracking circuit is determined, based on a current value of a transistor of the tracked circuit, the current value of the memory cell, and the tracking current value of the tracking memory cell. A signal of the tracked circuit is generated based on a signal of the tracking circuit.

In some embodiments, a circuit comprises a tracked circuit and a tracking circuit. The tracked circuit has a first data line electrically coupled with a first transistor and a first memory cell. The tracking circuit has a tracking data line electrically coupled with a first tracking transistor and a second memory cell. The first memory cell is configured to draw a first memory cell current. The second memory cell is configured to draw a second memory cell current. A value of the second memory cell current is related to a value of the first memory cell current by a ratio. The first transistor is configured to draw a first transistor current. The first tracking transistor is configured to draw a first tracking transistor current. A value of the first tracking transistor current is related to the first transistor current by the ratio.

In some embodiments, a circuit comprises a first data line and a tracking data line. The first data line is coupled with a logic circuit, a first memory cell controlled by a control line, a first charging circuit, and a first terminal of a first PMOS transistor. A second terminal of the first PMOS transistor is coupled with a second PMOS transistor. A third terminal of the first PMOS transistor is coupled with the logic circuit. The second PMOS transistor is coupled with a third PMOS transistor. The first tracking data line is coupled with a tracking logic circuit, a second memory cell controlled by a tracking control line, and a first terminal of a first tracking PMOS transistor. A second terminal of the first tracking PMOS transistor is coupled with a second tracking PMOS transistor. A third terminal of the first tracking PMOS transistor is coupled with the tracking logic circuit. The second tracking PMOS transistor is coupled with a third tracking PMOS circuit. An output signal of the tracking logic circuit is configured to cause a transition of the control line.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor functions as a drain, and a drain functions as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method comprising:
    determining a current value of a memory cell of a tracked circuit, the memory cell coupled with a data line;
    determining a tracking current value of a tracking memory cell of a tracking circuit, the tracking memory cell coupled with a tracking data line; and
    determining a current value of a transistor of the tracking circuit, based on a current value of a transistor of the tracked circuit, the current value of the memory cell, and the tracking current value of the tracking memory cell,
    wherein
        a signal of the tracked circuit is generated based on a signal of the tracking circuit.

2. The method of claim 1, wherein $$N=TK\_Icell/Icell=TK\_Crbl/Crbl=TK\_Ikp/Ikp;$$

TK_Icell represents the tracking current value of the tracking memory cell;
Icell represents the current value of the memory cell;
TK_Crbl represents a load of the tracking data line;
Crbl represents a load of the data line;
TK_Ikp represents the current value of the transistor of the tracking circuit; and
Ikp represents the current value of the transistor of the tracked circuit.

3. The method of claim 1, wherein
the current value of the memory cell represents a first statistical value of a plurality of values of a corresponding plurality of memory cells; and
the tracking current value of the tracking memory cell represents a second statistical value of the plurality of values of the corresponding plurality of memory cells.

4. The method of claim 1, wherein
the current value of the memory cell represents a worst case value of a plurality of values of a corresponding plurality of memory cells.

5. The method of claim 1, wherein at least one of the following conditions is met:
the current value of the memory cell is a $-6\sigma$ value of a plurality of values of a corresponding plurality of memory cells; and
the tracking current value of the tracking memory cell is a $+1\sigma$ value of the plurality of values of the corresponding plurality of memory cells.

6. The method of claim 1, wherein
a capacitive load of the tracking data line is related to a capacitive load of the data line by a ratio.

7. A circuit comprising:
a tracked circuit having a first data line electrically coupled with a first transistor and a first memory cell; and
a tracking circuit having a tracking data line electrically coupled with a first tracking transistor and a second memory cell,
wherein
    the first memory cell is configured to draw a first memory cell current;
    the second memory cell is configured to draw a second memory cell current;
    a value of the second memory cell current is related to a value of the first memory cell current by a ratio;
    the first transistor is configured to draw a first transistor current;
    the first tracking transistor is configured to draw a first tracking transistor current; and
    a value of the first tracking transistor current is related to the first transistor current by the ratio.

8. The circuit of claim 7, wherein
the tracked circuit comprises
    a second transistor coupled with the first transistor; and
    a third transistor coupled with the second transistor and the first data line; and
the tracking circuit comprises
    a second tracking transistor coupled with the first tracking transistor; and
    a third tracking transistor coupled with the second tracking transistor and the first tracking data line.

9. The circuit of claim 8, wherein
the tracking circuit comprises a second tracking data line electrically coupled with the first tracking transistor, and a third memory cell.

10. The circuit of claim 9, wherein
the tracking circuit comprises
    a fourth tracking transistor coupled with the first tracking transistor; and
    a fifth tracking transistor coupled with the fourth tracking transistor and the second tracking data line.

11. The circuit of claim 7, wherein
the tracked circuit comprises a logic circuit coupled with the first data line; and
the tracking circuit comprises a tracking logic circuit coupled with the first tracking data line.

12. The circuit of claim 11, wherein
the tracked circuit is configured to meet at least one of the following conditions:
    the logic circuit includes a first NAND gate; or
    the tracking logic circuit includes a second NAND gate.

13. The circuit of claim 11, wherein
the first memory cell is controlled by a control line;
the tracking memory cell is configured to cause a transition of the tracking data line; and
the tracking logic circuit, based on the transition of the tracking memory cell, is configured to cause a transition of the control line.

14. The circuit of claim 7, wherein
the data line has a load;

the tracking data line has a tracking load; and
the tracking load is a multiple of the load.

15. A circuit comprising:
a first data line coupled with
   a logic circuit;
   a first memory cell controlled by a control line;
   a first charging circuit; and
   a first terminal of a first PMOS transistor, wherein a second terminal of the first PMOS transistor is coupled with a second PMOS transistor, a third terminal of the first PMOS transistor is coupled with the logic circuit, the second PMOS transistor is coupled with a third PMOS circuit; and
a first tracking data line coupled with
   a tracking logic circuit;
   a second memory cell controlled by a tracking control line; and
   a first terminal of a first tracking PMOS transistor, wherein a second terminal of the first tracking PMOS transistor is coupled with a second tracking PMOS transistor, a third terminal of the first tracking PMOS transistor is coupled with the tracking logic circuit, the second tracking PMOS transistor is coupled with a third tracking PMOS circuit,
wherein
   an output signal of the tracking logic circuit is configured to cause a transition of the control line.

16. The circuit of claim 15, further comprising
a second tracking data line coupled with
   the first tracking data line;
   the tracking logic circuit; and
   a third memory cell controlled by the tracking control line; and
   a first terminal of a fourth tracking PMOS transistor, wherein a second terminal of the fourth tracking PMOS transistor is coupled with a fifth PMOS transistor, a third terminal of the fourth tracking PMOS transistor is coupled with the tracking logic circuit, the fifth tracking PMOS transistor is coupled with the third tracking PMOS transistor.

17. The circuit of claim 15, wherein
the third PMOS transistor is configured to draw a third PMOS transistor current;
the third tracking PMOS transistor is configured to draw a third tracking PMOS transistor current; and
a value of the third PMOS transistor current is related to a value of the third tracking PMOS transistor current by a ratio.

18. The circuit of claim 17, wherein
the first memory cell is configured to draw a first memory cell current;
the second memory cell is configured to draw a second memory cell current; and
a value of the first memory current is related to a value of the second memory current by the ratio.

19. The circuit of claim 15, wherein
data stored in the tracking memory cell is configured to effect the output signal of the tracking logic circuit.

20. The circuit of claim 15, wherein
the circuit is configured to meet at least one of the following conditions:
   the first charging circuit includes a PMOS transistor;
   the logic circuit includes a NAND gate;
   the first tracking charging circuit includes a PMOS transistor; or
   the tracking logic circuit includes a NAND gate.

* * * * *